(12) United States Patent
Nishi et al.

(10) Patent No.: US 11,616,188 B2
(45) Date of Patent: Mar. 28, 2023

(54) PRECURSOR OF SUPERCONDUCTING WIRE AND METHOD OF MANUFACTURING SUPERCONDUCTING WIRE

(71) Applicant: Hitachi, Ltd., Tokyo (JP)

(72) Inventors: Kazuya Nishi, Tokyo (JP); Takaaki Suzuki, Tokyo (JP); Hideki Tanaka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 1269 days.

(21) Appl. No.: 16/076,182

(22) PCT Filed: Feb. 19, 2016

(86) PCT No.: PCT/JP2016/054772
§ 371 (c)(1),
(2) Date: Aug. 7, 2018

(87) PCT Pub. No.: WO2017/141410
PCT Pub. Date: Aug. 24, 2017

(65) Prior Publication Data
US 2021/0193898 A1    Jun. 24, 2021

(51) Int. Cl.
*H01L 39/14* (2006.01)
*H01B 12/10* (2006.01)
(Continued)

(52) U.S. Cl.
CPC .......... *H01L 39/141* (2013.01); *H01B 12/10* (2013.01); *H01B 13/0006* (2013.01); *H01L 39/2487* (2013.01)

(58) Field of Classification Search
CPC .............. H01L 39/141; H01L 39/2487; H01B 13/0006; H01B 12/10
See application file for complete search history.

(56) References Cited

U.S. PATENT DOCUMENTS

| 2004/0204322 A1* | 10/2004 | Tanaka ................. H01L 39/141 505/100 |
| 2009/0005251 A1 | 1/2009 | Fluekiger et al. |
| 2009/0305897 A1* | 12/2009 | Grasso ................. H01L 39/141 505/232 |

FOREIGN PATENT DOCUMENTS

| CN | 104091651 A | 10/2014 |
| JP | 63-213211 A | 9/1988 |

(Continued)

OTHER PUBLICATIONS

International Search Report (PCT/ISA/210) issued in PCT Application No. PCT/JP2016/054772 dated Apr. 26, 2016 with English translation (four (4) pages).

(Continued)

*Primary Examiner* — Paul A Wartalowicz
(74) *Attorney, Agent, or Firm* — Crowell & Moring LLP (57) ABSTRACT

Proposed is a novel embedded structure for suppressing a disturbance in the cross sectional shape and a non-uniform deformation of a metal member arising in a precursor when producing an MgB2 multi-core wire material by a surface reduction process. This superconductive multi-core wire material precursor is characterized by having: soft Cu and Fe pure metals disposed in the center; mixed powder elements, each comprising as a sheath material a metal such as Fe or Nb having a barrier effect preventing a reaction between Mg and Cu, the mixed powder elements being disposed in a form that surrounds the periphery of the soft metal serving as the central material; and disposed around these, an outer shell layer produced from a harder metal than the central material and the sheath material.

6 Claims, 3 Drawing Sheets

(51) Int. Cl.
  *H01B 13/00*    (2006.01)
  *H01L 39/24*    (2006.01)

(56) References Cited

FOREIGN PATENT DOCUMENTS

| | | |
|---|---|---|
| JP | 2008-91325 A | 4/2008 |
| JP | 2011-90788 A | 5/2011 |
| JP | 2014-143056 A | 8/2014 |
| WO | WO 2015/049776 A1 | 4/2015 |

OTHER PUBLICATIONS

Japanese-language Written Opinion (PCT/ISA/237) issued in PCT Application No. PCT/JP2016/054772 dated Apr. 26, 2016 (four (4) pages).

Tomsic et al., "Development of magnesium diboride ($MgB_2$) wires and magnets using in situ strand fabrication method," Physica C 456, 2007, pp. 203-208, Elsevier B.V., (six (6) pages).

Sumption et al., "High Critical Current Density Multifilamentary $MgB_2$ Strands," IEEE Transactions on Applied Superconductivity, Jun. 2007, pp. 2838-2841, vol. 17, No. 2, (four (4) pages).

Extended European Search Report issued in counterpart European Application No. 16890551.1 dated Jul. 11, 2019 (nine (9) pages).

\* cited by examiner

| No. | | NUMBER OF FILAMENTS | CORE MATERIAL | SHEATH MATERIAL | OUTERMOST SHELL LAYER | CORE MATERIAL | SHEATH MATERIAL | OUTERMOST SHELL LAYER | SECTIONAL SHAPE DISORDER |
|---|---|---|---|---|---|---|---|---|---|
| 1 | EXAMPLE | 6 | Cu/Fe | Fe | NiCu | 60 | 170 | 240 | A |
| 2 | " | 6 | Cu/Fe | Nb | NiCu | 60 | 170 | 240 | A |
| 3 | " | 6 | Fe | Fe | NiCu | 160 | 170 | 240 | B |
| 4 | " | 6 | Fe | Fe | NiCu | 110 | 170 | 240 | A |
| 5 | " | 6 | Fe | Fe | NiCu | 110 | 190 | 240 | A |
| 6 | " | 6 | Fe | Nb | NiCu | 110 | 210 | 240 | B |
| 7 | " | 6 | Fe | Nb | NiCu | 110 | 170 | 240 | A |
| 8 | " | 6 | Fe | Fe | NiCu | 110 | 190 | 240 | A |
| 9 | " | 6 | Fe | Nb | NiCu | 110 | 210 | 240 | B |
| 10 | " | 30 | Cu/Fe | Fe | NiCu | 60 | 170 | 240 | A |
| 11 | " | 30 | Cu/Fe | Nb | NiCu | 60 | 170 | 240 | A |
| 12 | " | 30 | Fe | Fe | NiCu | 160 | 170 | 240 | A |
| 13 | " | 30 | Fe | Nb | NiCu | 110 | 170 | 240 | A |
| 14 | " | 30 | Fe | Fe | NiCu | 110 | 170 | 240 | A |
| 15 | COMPARATIVE EXAMPLE | 6 | Fe | Fe | Cu | 110 | 170 | 100 | C |
| 16 | " | 6 | Fe | Fe | Fe | 110 | 170 | 100 | C |
| 17 | " | 6 | Fe | Nb | NiCu | 110 | 240 | 240 | C |
| 18 | " | 6 | Fe | Fe | NiCu | 110 | 240 | 240 | C |
| 19 | " | 6 | Fe | Fe | NiCu | 240 | 170 | 240 | C |
| 20 | " | 6 | Nb | Nb | NiCu | 240 | 170 | 240 | C |
| 21 | " | 6 | NiCu | Fe | NiCu | 240 | 170 | 240 | C |
| 22 | " | 30 | NiCu | Fe | NiCu | 240 | 170 | 240 | C |

PRECURSOR OF SUPERCONDUCTING WIRE AND METHOD OF MANUFACTURING SUPERCONDUCTING WIRE

TECHNICAL FIELD

The present invention relates to a precursor of a MgB2 multi-core wire applicable to a high magnetic field and the like.

BACKGROUND ART

A $MgB_2$ superconductor has the highest critical temperature (39 K) as a metal-based superconductor and is expected as an excellent superconducting material. If the $MgB_2$ superconductor is applied to a superconducting electromagnet of a superconducting magnet system (for example, NMR or MRI), since it is possible to increase a difference between a critical temperature and a use temperature compared to a case where an electromagnet is made of $Nb_3Ti$ or $Nb_3Sn$ of a superconducting material in the related art, quenching hardly occurs and it is possible to provide a superconducting magnet system with high thermal stability.

A MgB2 superconducting wire is generally prepared by a so-called powder-in-tube process (hereinafter, abbreviated as PIT method) of filling a metal tube with powders as a raw material and performing wire drawing. There exist two methods of a case (ex-situ method) where powders already synthesized into $MgB_2$ are used as raw material powders and a case (in-situ method) where $MgB_2$ is synthesized by performing heat treatment after finishing wire drawing using mixed powders of Mg (magnesium) powders and B (boron) powders. A wire prepared by the in-situ method of synthesizing MgB2 afterwire drawing has a high degree of coupling of MgB2 phase and is capable of micronizing crystal grains of the MgB2 phase by lowering a reaction heat treatment temperature. As a result, the in-situ method has characteristics of increasing pinning sites of a magnetic flux line and having a high critical current density (Jc), which are more advantageous than those of the ex-situ method.

Practical superconducting wires are used by constituting a multi-core wire obtained by bundling a plurality of superconducting filaments with fine wire diameter in many cases, for the purpose of stably maintaining the magnetic flux. In preparing a multi-core wire, initially mixed powders of Mg and B which are raw materials of filaments are filled in a metal sheath material and subjected to a drawing process and the like using a die to prepare a rod-like member (mixed powder element) made of a filament.

A plurality of mixed powder elements is bundled and incorporated into a metal pipe, the pipe incorporated with the elements passes through a die by using a draw plier to repeat the process, and a sectional area is gradually reduced. A multi-core wire after fishing the process is subjected to heat treatment, and $MgB_2$ is subjected to reaction synthesis to obtain a superconducting wire having a multi-core structure. A constituent body in a state of the plurality of mixed powder elements being incorporated into the metal pipe before performing reduction process is referred to as a precursor of a superconducting multi-core wire. The metal pipe on a surface of the precursor is referred to as an outer shell layer.

When constituting a precursor, it is necessary to incorporate a metal Cu for stabilizing a superconductor (Cu stabilizing material) in the inside. The Cu stabilizing material can be put into a gap between the mixed powder elements in a rod-like form, or a metal sheath material of the mixed powder elements can be used as Cu. On the other hand, if the Mg powders directly come into contact with Cu, when synthesizing $MgB_2$ at a high temperature, $CuMg_2$ are generated more than MgB2. Therefore, it is necessary to use a metal such as Nb and Fe having a barrier function for preventing reaction between Cu and Mg as a sheath material of the mixed powder elements. When using Cu as a sheath material, reaction between Cu and Mg is prevented by setting a double structure in which Cu is positioned on an outer side of the barrier metal.

Citation List

Non-Patent Literature

Cases of the $MgB_2$ multi-core wire prepared by the above method are reported in the following Technical Documents (1) and (2).

Non-PTL 1: M Tomsic, M Rindfleisch, J Yue, et al., Development of magnesium diboride (MgB2) wires and magnets using in situ strand fabrication method, Physica C, 456 (2007) 203-208

Non-PTL 2: M. D. Sumption, M. A. Susner, M. Bhatia, et al., High Critical Current Density Multifilamentary MgB2 Strands, IEEE Trans, on Appl. Supercond., Vol. 17, No. 2, Jun-2007, pp. 2838-2841.

SUMMARY OF INVENTION

Technical Problem

When preparing a $MgB_2$ multi-core wire by the PIT in-situ method, there is a problem in that $MgB_2$ synthesis reaction is destabilized during heat treatment. In a case where a barrier metal layer of the mixed powder element becomes gradually thin, and a part thereof is broken in a course of wire drawing process on the precursor, Mg powders easily react with the ambient Cu stabilizing material. As a result, continuity of the $MgB_2$ filaments are lost at sites where the barrier layer of the wire is broken, and thus deterioration of Jc is caused.

As a cause of breaking of a barrier during a wire drawing process, non-uniform deformation of the metal member that occurs in the inside of the precursor and disorder of a shape of the mixed powder element section due to this are expected. In a case where a superconducting wire is obtained by the drawing process, a stress applied to the inside of the wire, when a wire passes through a die and thus the sectional area is contracted, is not uniform. Compressive stress is the highest in a wire surface portion immediately below a die and compressive stress in the vicinity of a central portion of the wire is decreased. If a hard metal or a mixed filament element is disposed in the central portion, an outer peripheral portion is preferentially processed than the central portion of the wire at the time of drawing process, and thus there occurs non-uniform deformation in which an elongation amount in the central portion and an elongation amount in the outer peripheral portion are different from each other.

On the other hand, in a case of setting a structure in which a soft Cu stabilizing material is disposed on an outer shell layer of the precursor and the mixed powder element is embedded in the inside of the Cu stabilizing material, since strong compressive stress is applied to Cu on a surface of the precursor, prominent deformation occurs on the surface portion As a result, disorder of the disposition of the mixed powder element in the inside of the precursor is caused, and there occurs a problem in that the mixed powder element is exposed to the outer side during wire drawing, and broken, depending on the case.

As the number of times of the drawing pass due to the die is increased, the problem of non-uniform deformation becomes prominent. Since a wire used in an evaluation test for study is long enough to be a few meters, an outer diameter of the precursor in an incorporation stage is small and the number of times of the drawing pass is comparatively small. On the other hand, a superconducting wire used in practical products such as an MRI coil is required to have a length of several km, an area or an outer diameter of the precursor at the time of incorporation is increased compared to the material for study. Since the number of times of the drawing pass is also increased, a shape disorder due to non-uniform deformation prominently occurs.

Solution to Problem

The present invention relates to a precursor for obtaining a $MgB_2$ superconducting multi-core wire, and suggests a new incorporation structure for suppressing non-uniform deformation that occurs when performing a drawing process on the precursor. A soft Cu- and Fe-based metal is disposed in the center of the precursor, and a mixed powder element using a metal having a barrier effect of preventing reaction between Mg such as Fe and Nb and Cu as a sheath material is disposed in the form of surrounding the periphery of the soft metal which is a core material. In addition, the super conducting multi-core wire precursor is characterized in that the core material and an outer shell layer prepared by a metal harder than the sheath material are disposed on an outer side thereof.

Advantageous Effects of Invention

By passing the precursor having such a structure through the die and repeating reduction process due to drawing, uniform deformation occurs from the outer side to the central portion of the precursor, and as a result, a $MgB_2$ multi-core incorporated wire having a favorable sectional shape in which the sheath material is not broken and disorder of the filament shape is suppressed is obtained.

DESCRIPTION OF EMBODIMENTS

The precursor of a superconducting multi-core wire of the present invention includes 3 elements of a core material, a mixed powder element, and an outer shell layer. The core material and the mixed powder element are rod-like members having a hexagonal-shaped section. The precursor is configured by disposing the mixed powder element around the core material to surround the core material without any gap and incorporating the mixed powder element in the inside of the outer shell layer. The section of the mixed powder element is preferably hexagonal-shaped, and the section of the core material may have a circular shape in addition to a hexagonal shape.

As the core material, the softest metal among the metals constituting the precursor is preferably used. Specifically, the core material is preferably selected from any one of pure Cu, pure Fe, pure Nb, and pure Ni.

The mixed powder element is a member obtained by packing the inside of the metal sheath material with mixed powders of Mg and B. As the sheath material, a metal material having a barrier function of not reacting with Mg at the time of high temperature heating is preferably used. Specifically, the sheath material is preferably selected from any one of body-centered cubic metals not forming a compound with Mg such as pure Fe, pure Nb, and pure Ta and alloys having these body-centered cubic metals as a main body. The sheath material is preferably a single layer of these barrier metal materials. In a case of having a two-layer structure in which a Cu stabilizing material is added to the outer side, there is a probability that reaction between Mg powders and Cu occurs in a case where the barrier layer is broken, and thus the two-layer structure is not preferable.

As a metal of the outer shell layer, the hardest metal among the metals constituting the precursor is preferably used. If the metal has a Vickers hardness of 200 or higher and high ductility resistant to repeated drawing processes, the type of the metal is not particularly limited and, for example, an alloy (monel) obtained by adding Cu to Ni in a range of 20% to 80% and the like is preferably used.

Hereinafter, a procedure of preparing of the precursor of the present invention is shown.

Powders obtained by mixing elementary powders of Mg and B at an optimal ratio for being capable of generation of $MgB_2$ are filled in the inside of a metal pipe as a sheath material, and drawing process due to a die is performed. Sectional area reduction due to drawing is repeated to refine the mixed powders in the inside, and the resultant passes through a hexagonal die at the final process stage to prepare a hexagonal sectional-shaped mixed powder element.

The metal as the core material is processed into a rod-like form of the same shape and size of hexagonal section as that of the above mixed powder element. When incorporated into an outer shell layer as a precursor, the core material is disposed such that the periphery of one core material is surrounded by the mixed powder element without any gap. The sectional shape of the core material can be a circular section with a size that can be put in the gap between the disposed mixed power elements, in addition to the hexagonal section.

In a case where pure Cu or pure Ni having a function of a stabilizing material is used as the core material, there is a probability that, when a sheath material (barrier layer) of the ambient mixed powder element is broken during a drawing process, reaction between Cu or Ni and Mg occurs and generation of $MgB_2$ is inhibited. As a measure against this problem, by covering the periphery of a Cu rod of the core material with a metal having the same barrier function as that of the sheath material, it is possible to prevent reaction between Cu and Mg in a case where the sheath material on the mixed powder element side is broken. In a case where a metal not reacting with Mg such as Fe and Nb is used as the core material, it is not necessary to cover the surface with a different metal.

Figure 1:
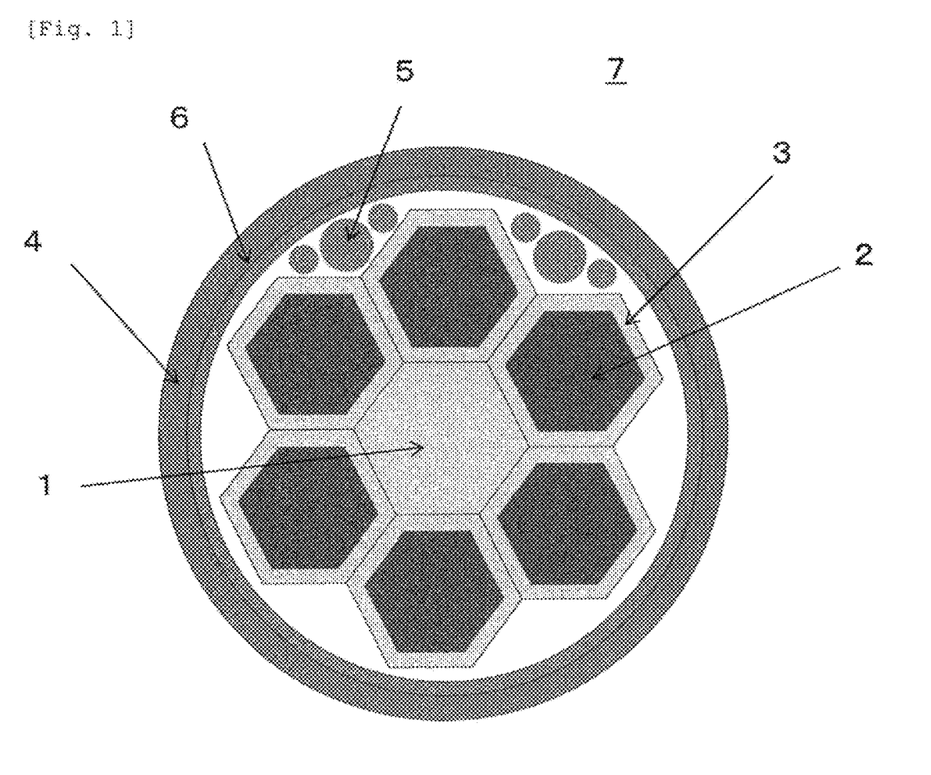
FIG. 1 illustrates a precursor in a case where 6 mixed powder elements are disposed around one core material and incorporated into an outer shell layer.

FIG. 1 shows an incorporation structure of a precursor 7 in a case where 6 mixed powder elements are disposed around one core material 1, and incorporated into an outer shell layer 4. The mixed powder element is made of a mixed powder 2 and a sheath material 3. A void in the incorporation structure is present between the mixed powder element and the outer shell layer 4. A circular rod of Cu and the like is disposed in the void as a stabilizing material as shown in FIG. 1. Here, FIG. 1 shows two types of stabilizing materials of a stabilizing material (inner side) 5 disposed on an inner side and a stabilizing material (outer side) 6 disposed on an outer side. The two types of the stabilizing materials are preferably made by using Cu, and play a role of improving conductivity. In view of improving conductivity, using Cu in the core material is also effective.

As a result of examination, it was found that, when a precursor 7 of the structure shown in FIG. 1 was subjected to reduction process due to drawing, the thickness of the sheath material 3 of the mixed powder element was reduced more on the inner side close to the core material 1 and was almost not reduced on the outer side close to the outer shell layer 4. For this reason, it was recognized that, by disposing the stabilizing material (inner side) 5 with the mixed powder element so as to fill the void of the outer shell layer as shown in FIG. 1, or disposing a Cu pipe as the stabilizing material (outer side) 6 on the inner side of the outer shell layer as in FIG. 1, and disposing the core material 1 and the mixed powder element in the inside of the Cu pipe, it is possible to prevent an impact on $MgB_2$ synthesis reaction.

The number of the mixed powder elements incorporated into the outer shell layer 4 is not particularly limited as long as the number of the mixed powder elements is 6 or greater as in FIG. 1. In a case where the number of the introduced mixed powder elements is increased, the number of the core materials 1 is also easily increased from 1 to 7 and 19 to be incorporated.

Figure 2:
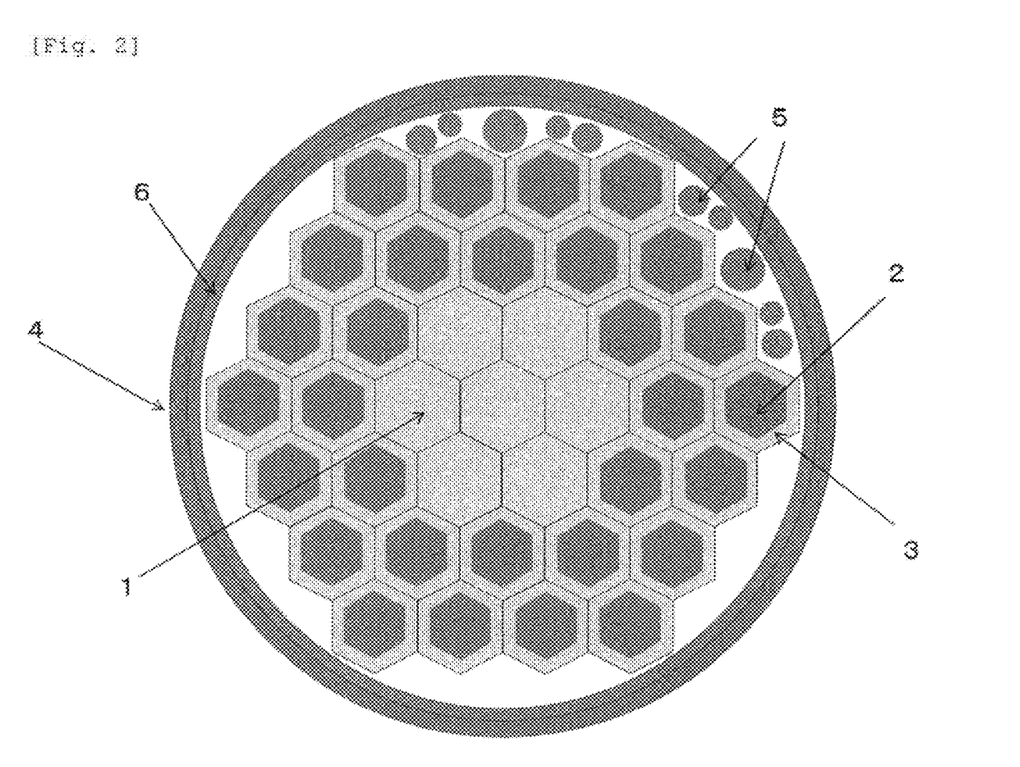
FIG. 2 illustrates a precursor in a case where 30 mixed powder elements are disposed around 7 core materials and incorporated into an outer shell layer.

FIG. 2 shows an incorporation structure of the precursor 7 in a case where 30 mixed powder elements are disposed around 7 core materials 1 to be incorporated into the outer shell layer 4.

The hardness of the metal material constituting the precursor 7 is required to be high in an order of the core material 1, the core material 1, the sheath material 3, and the outer shell layer 4. The compressive stress applied during drawing process is the greatest in the vicinity of the surface of the precursor 7, and is decreased toward the center of the precursor 7. Considering the distribution of the compressive stress during the process, by providing a hardness gradient from the outer side to the inner side of the precursor, it is possible to adjust an elongation amount of each member during the drawing process in accordance with the compressive stress and homogenize deformation in the entire area of the precursor 7.

On the contrary, in a case of setting a structure in which the central portion of the precursor 7 is hard and the outer shell layer 4 is soft, since deformation of the precursor 7 during the process is concentrated only on the outer side and deformation of the core material 1 is suppressed, non-uniform deformation is caused. As a result, there occurs problems in that shape disorder of the mixed powder element in a section of the precursor 7, divergence in disposition, tear of the sheath material, and the like occur, breaking of the wire during the wire drawing process occurs or MgB2 synthesis reaction is inhibited, and thus Jc deteriorates.

In the precursor 7, the hardness of the core material 1 and the hardness of the sheath material 3 are similar, but the hardness of the sheath material 3 is preferably higher, and it is required to be avoided that the core material 1 is harder than the sheath material 3. On the other hand, the hardness of the outer shell layer 4 is higher than the sheath material by HV30 or higher, and preferably by HV50 or higher.

The hardness of the metal material is not constant, and the hardness of the metal material is increased as plastic deformation during the drawing process is received. On the other hand, by performing heat treatment on the metal material and thereby releasing plastic strain, the hardness deteriorates. The Vickers hardness of high purity Cu with an equivalent level of high purity as that of oxygen-free copper is approximately HV50 to HV60 in a case where strain is completely released by annealing, and is increased to a maximum of HV120 by applying plastic process. On the ether hand, the hardness of pure Fe is approximately HV110 in a case where strain is completely released at 800° C., and the hardness after the plastic process is increased to a maximum of HV320. The hardness of pure Nb is HV110 in a case where heat treatment is performed at 900° C. or higher, and is increased to a maximum of HV280 after the plastic process.

First, the hardness of the core material of the precursor is described. If Cu covered with a Fe layer is set as the core material, the hardness of Cu is decreased to HV50 to HV70 by performing annealing for releasing strain at 400° C. to 500° C. In addition, in a case where pure Fe is set as the core material, the hardness of pure Fe is decreased to HV110 to HV130 by performing annealing for releasing strain at 700° C. to 800° C. The hardness of the metal of the core material is preferably as the above condition.

Next, the hardness of the sheath material is described. When preparing the mixed powder element, if a pipe of pure Fe or pure Nb having a hardness of HV110 from which strain is completely released is used as the sheath material, the sheath hardness after being processed into a hexagonal sectional shape is approximately HV220 to HV280 in the case of pure Fe and approximately HV170 to HV220 in the case of pure Nb. Since the sheath material in this state is sufficiently harder than the Cu core material, the sheath material can be used without any problem. In a case where Fe sheath is used, since the sheath hardness can be decreased to HV180 to HV150 by performing heat treatment at 450° C. to 500° C. on the mixed powder element after being processed into a hexagonal shape, the sheath can be used in this state.

If the mixed powder element is subjected to heat treatment at 500° C. or higher, reaction between Mg powders and B powders is started and $MgB_2$ is generated in the inside of the mixed powders although it is a small amount. Since generation of $MgB_2$ inhibits ductility of the drawing process and causes defects such as breaking of the wire, heat treatment of the mixed powder element at 500° C. or higher should be avoided. Since a strain release annealing temperature of Nb is 900° C. or higher, it is not possible to deteriorate the hardness of Nb sheath by performing heat treatment on the precursor.

Considering a monel alloy (70% Ni to 30% Cu) as a material of the outer shell layer, the hardness in a case where strain is completely released is HV180, and the hardness is increased to a maximum of approximately HV320 after plastic process. Since the hardness of the outer shell layer can be adjusted by heat treatment before incorporation, the monel alloy is preferably used as the outer shell layer of the precursor by setting the hardness of the monel alloy to be HV30 or higher than that of the sheath material of the mixed powder element.

By configuring the precursor by combining the core material, the sheath material, and the outer shell layer (monel alloy) described above and repeating drawing process using a die, it is possible to generate uniform deformation of the entire area of the precursor. The reduction rate between dies during drawing process is preferably in a range exceeding 5%. By repeating reduction process by drawing, the harnesses of the core material, the sheath material, and the outer shell layer are gradually increased, but the order of hardness of the core material, the sheath material, and the outer shell layer during the process is not changed.

After the precursor reaches a predetermined outer diameter by the drawing process, the wire is subjected to heat treatment at 550° C. to 800° C., Mg powders and B powders in the inside of the mixed powder element are reacted with each ether, and the MgB2 filaments are synthesized to obtain a superconducting multi-core wire. After $MgB_2$ is synthesized, if deformation is applied to the wire due to excessive strain or bending, since the filaments are broken and superconductivity is degraded, heat treatment for MgB2 synthesis is preferably performed after performing winding into a predetermined product shape such as coil.

EXAMPLES

Hereinafter, examples are described.

Example 1

First, a preparation procedure of a mixed powder element is described. Mixed powders of pure Mg and pure B weighed in a predetermined amount were molded to prepare pellets of φ12 mm. The mixed powder pellets were filled in a pipe of pure Fe and pure Nb having an outer dimeter of 18 mm and an inner diameter of 15 mm, and reduction process using a draw plier was repeatedly performed. A die shape at the time of the final process was changed from a circular type to a hexagonal type to prepare a single-core mixed powder element of a hexagonal section having an opposite side length of 5.5 mm.

Next, a preparation procedure of a core material is described. A pure Cu rod material having an outer diameter of 16 mm and an inner diameter of 13.5 mm was packed in a pure iron pipe having an inner diameter of 14 mm, and swaging and reduction process using a draw plier were repeated to prepare a Cu/Fe composite rod material of a hexagonal section having the same opposite side length of 5.5 mm as that of the mixed powder element. Similarly, a pure Fe rod material of a hexagonal section having an opposite side length of 5.5 mm was prepared using a circular rod of pure Fe of φ13 mm.

A NiCu alloy (70% Ni 30% Cu) was used in an outer shell layer, and a pipe of pure Cu having an inner diameter of 18.5 mm and an outer diameter of 19.5 mm was disposed in the inside of the NiCu alloy pipe having an inner diameter of 20 mm and an outer diameter of 22 mm.

Figure 3:
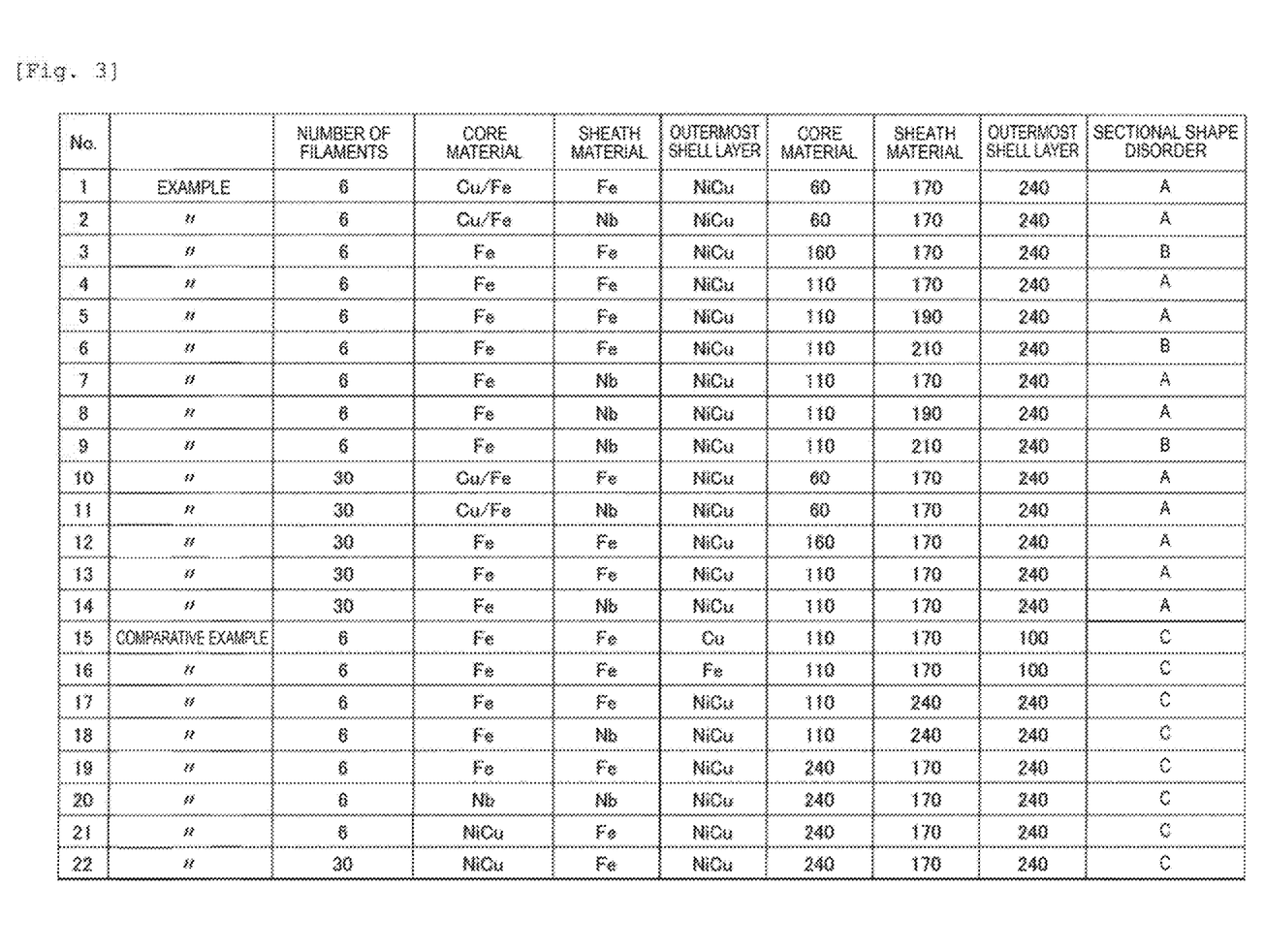
FIG. 3 shows performance values of precursors of Examples and Comparative Examples.

FIG. 3 shows a performance values cf precursors of Examples and Comparative Examples.

In No. 1 which is an example, 6 Fe sheath mixed powder elements were disposed around a Cu/Fe core material, and incorporated into an inside of a NiCi/Cu double pipe to obtain a precursor. In No. 2 which is an example, 6 Nb sheath mixed powder elements were disposed around a Cu/Fe core material to obtain a precursor.

In Nos. 3 to 6 which are examples, 6 Fe sheath mixed powder elements were disposed around a Fe core material to obtain a precursor. In Nos. 7 to 9 which are examples, 6 Nb sheath mixed powder elements were disposed around a Fe core material to obtain a precursor.

The core materials and the sheath materials (mixed powder elements) of Nos. 1 to 9 were subjected to heat treatment at various temperatures before and after being processed into a hexagonal section, and hardened as shown in FIG. 3. Heat treatment of the mixed powder elements was performed in a range of 450° C. to 500° C. for preventing reaction between Mg and B. The hardness of the outer shell layer was adjusted to be HV240 by heat treatment.

The hardness of the core material was set to HV60 at Cu/Fe of Nos. 1 and 2. The hardness of Nos. 1 and 2 was set as a measurement value of the Cu moiety. The core material of Nos. 3 to 9 was Fe, but the hardness of the core material of No. 3 was HV160 which was a value higher than those of Nos. 4 to 9 by HV50. The hardness of the sheath material was HV170 in Nos. 1 to 4 and 7, and was increased to HV190 in Nos. 5 and S, and to HV210 in Nos. 6 and 9.

Reduction process using a draw plier was repeatedly performed on precursors of Nos. 1 to 9 to obtain an incorporation wire having an cuter diameter of 2 mm. During the reduction process, no damage such as cracks occurred on a surface of the wire and the wire showed favorable appearance. The wire having an outer diameter of 2 mm after the reduction process was cut, and a raicrestructure on the section was observed with an optical microscope. In the mixed power element after the process, it was shown that a sectional shape in the mixed powder area was tended to be drawn in an outer peripheral direction compared to a hexagonal shape at the time of incorporation.

In a sectional structure of the incorporation wire after the reduction process, a ratio (aspect ratio) of maximum length/minimum length of a sectional shape of the mixed powder element as shown in FIGS. 1 and 2 was obtained. The aspect ratios in the mixed powder areas of Nos. 1, 2, 4, 5, 7, and 8 were lower than 2, but the aspect ratios of Nos. 3, 6, and 9 were 2.2 to 2.6, which were slightly higher than those of other incorporation wires, and as a result, the sectional shape disorder was slightly greater (B in FIG. 3).

In FIG. 3, the hardness of the core material of No. 3 was HV160, which was higher than those of others and equivalent to that of the sheath material. Therefore, it is estimated that deformation in the central portion was slightly lower than in others, and the sectional shape of the mixed powder area was slightly disordered.

In the case of Nos. 6 and 9, the hardness of the sheath material was HV210, which was higher than that of other materials, and a difference between the hardness of the sheath material and the hardness of the outermost shell layer was HV30, which was low. For this reason, it is estimated that non-uniform deformation was caused during the reduction process, and the sectional shape of the mixed powder area was slightly disordered.

In Nos. 1, 2, 4, 5, 7, and 8, the hardness of the core material was lower than that of the sheath material by HV50 or higher, and the hardness of the sheath material was higher than that of the outermost shell layer by HV50 or higher. In these materials, since the hardness of the precursor was gently lowered from the outer side to the center of the precursor, it is considered that deformation of the precursor was uniformized at the time of the reduction process and the aspect ratio of the mixed powder area was lowered.

Example 2

In Nos. 10 to 14 which are examples of FIG. 3, 30 mixed powder elements were disposed around 7 core materials to prepare a precursor, as shown in FIG. 2. The dimension of the core material and the mixed powder element was set to have a hexagonal section having an opposite side length of 4.0 mm, and thus the core material and the mixed powder element were slightly miniaturized, compared to Example 1.

A NiCu alloy pipe having an inner diameter of 39 mm and an outer diameter of 43 mm was used in the outer shell layer. A pure Cu pipe having an inner diameter of 35.0 mm and an outer diameter of 38 mm was disposed on an inner side of the outer shell layer as a stabilizing material, and an assembly of the core material and the mixed powder element was incorporated to obtain a precursor.

Similar to Example 1, the precursors of Nos. 10 to 14 were also obtained by repeating the reduction process using a draw plier and obtaining an incorporation wire having an outer diameter of 2 mm. The appearance of the wire during the reduction process was favorable.

The wire having an outer diameter of 2 mm after the reduction process was cut, and the microstructure of the section was observed with an optical microscope. In any of Nos. 10 to 14, it was found that aspect ratios of the mixed powder areas were lower than 2, and the shape disorder was small The harness of the core material and the sheath material was equivalent to that of No. 12, but the shape disorder (magnitude of the aspect ratio) of the mixed powder area was slightly improved than that of No. 3. It is estimated that by distributing the mixed powder elements in large numbers, uniform deformation of the precursor at the time of the reduction process was promoted.

COMPARATIVE EXAMPLES

Nos. 15 to 22 show results of Comparative Examples. In Nos. 15 and 16, pipes of pure Cu and pure Fe obtained by adjusting the hardness to HV100 as an outer shell layer were prepared, and used in the precursor instead of an NiCu alloy. Both of the core material and the sheath material was Fe, and the hardness of the core material was lower than that of the sheath material. In the course of obtaining the precursors of Nos. 15 and 16 by performing reduction process using a draw plier, fine irregularities were formed on the surface of the wire and grown over time, and before the irregularities were grown to have an outer diameter of 2.0 mm, cracks occurred on the surface.

As a result of observing the structure of the section in the vicinity of the surface cracks with an optical microscope, it was confirmed that in Nos. 15 and 16, deviation in the disposition of the mixed powder element occurred and a part of the sheath material tore the outer shell layer and protruded to the outer side. It is considered that, by using a soft metal in the outer shell layer, deformation during the reduction process was uniform and this resulted in the cracks.

In Nos. 17 and 18, the hardness of the sheath material and the outer shell layer was HV240, which was the same. Pure Fe of HV110 was used as the core material. By performing reduction process using a draw plier, the precursor was processed to have an outer diameter of 2.0 mm. However, as a result of observing appearance after the process, in any of Nos. 17 and 18, linear hair cracks occurred.

As a result of observing the structure of the section with an optical microscope, it was confirmed that the thickness of the outer shell layer was uniform, and hair cracks occurred at the thinnest site. In Nos. 17 and 18, it is considered that since the hardness of the sheath material and the hardness of the outer shell layer were the same as each other, deformation during the reduction process was uniform, and this resulted in formation of the hair cracks.

In Nos. 19, 20, and 21, a hard metal having a hardness of HV240 was disposed in the core material and the outer shell layer, and the sheath material was made the softest with the hardness of HV170 to prepare a precursor. Different types of metals such as Fe, Nb, and NiCu were used as the core material and the metal of the outer shell in ail examples was set as NiCu.

In the course of obtaining the precursors of Nos. 19, 20, and 21 by performing reduction process using a draw plier, since irregularities were gradually formed on the surface of the wire, the process was stopped in the middle thereof. As a result of observing the structure of the section with an optical microscope, it was found that deformation was concentrated on a portion of the mixed powder element and the sectional shape of the mixed powder area was slightly disordered. In a part of the element, a site where the sheath material was torn and the Cu stabilizing material on an outer side came into contact with the mixed powders. From all the sections of the precursors of Nos. 13, 14, and 15, tear of the sheath material was confirmed.

In the structures of the sections of Nos. 19, 20, and 21, since the core material was almost not deformed, it was found that, by disposing a hard metal at the center, deformation of the precursor was prominently non-uniform and the reduction process was greatly inhibited.

In No. 22, in a case where 30 mixed powder elements were disposed around 7 core materials, a precursor obtained by incorporating an NiCu alloy of HV240 into the core material was tentatively prepared. During the reduction process using a draw plier, damage on the surface also occurred in No. 22 and thus the process was stopped. As a result of observing the structure of the section, even in the case of No. 22, deformation was concentrated on the mixed powder elements and the sectional shape of the mixed powder area was prominently disordered. On the other hand, since the core material was almost not deformed, it was confirmed that deformation of the precursor was prominently non-uniform, and the reduction process was inhibited.

REFERENCE SIGNS LIST

1: Core material, 2: mixed powder, 3: sheath material, 4: outer shell layer, 5: stabilizing material (inner side), 6: stabilizing material (outer side), 7: precursor

The invention claimed is:
1. A precursor of a superconducting wire, comprising:
a core material;
a mixed powder element disposed around the core material; and
an outer shell layer disposed on an outer side of the core material and the mixed powder element,
wherein the mixed powder element includes mixed powders containing Mg powders and boron powders and a metal sheath material covering the mixed powders, and
wherein the Vickers hardness is great in an order of the core material, the metal sheath material, and the outer shell layer, and
wherein a first stabilizing material of Cu formed as a plurality of rods is disposed in a void between the mixed powder element and the outer shell layer, and a second stablizing material of Cu formed as a pipe outside of the plurality of rods is disposed on an inner side of the outer shell layer.
2. The precursor of a superconducting wire according to claim 1,
wherein a difference in hardness between the metal sheath material and the outer shell layer is 30 or greater in terms of a value of the Vickers hardness.
3. The precursor of a superconducting wire according to claim 1, wherein a difference in hardness between the metal sheath material and the outer shell layer is 50 or greater in terms of a value of the Vickers hardness.

4. The precursor of a superconducting wire according to claim 1,
wherein the core material is any one of Cu, Fe, Nb, and Ni,
wherein the metal sheath material is any one of Fe, Nb, and Ta, and
wherein the outer shell layer is an alloy containing Ni.

5. The precursor of a superconducting wire according to claim 2,
wherein the core material is any one of Cu, Fe, Nb, and Ni,
wherein the metal sheath material is any one of Fe, Nb, and Ta, and
wherein the outer shell layer is an alloy containing Ni.

6. The precursor of a superconducting wire according to claim 3,
wherein the core material is any one of Cu, Fe, Nb, and Ni,
wherein the metal sheath material is any one of Nb and Ta, and
wherein the outer shell layer is an alloy containing Ni.

* * * * *